US010854411B2

(12) United States Patent
Khlat

(10) Patent No.: US 10,854,411 B2
(45) Date of Patent: Dec. 1, 2020

(54) MICROELECTROMECHANICAL SYSTEMS (MEMS) SWITCHING CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

(*) Notice: Subject to any disclaimer, the term of this patent is extended or adjusted under 35 U.S.C. 154(b) by 124 days.

(21) Appl. No.: 16/243,367

(22) Filed: Jan. 9, 2019

(65) Prior Publication Data
US 2019/0371554 A1 Dec. 5, 2019

Related U.S. Application Data

(60) Provisional application No. 62/680,240, filed on Jun. 4, 2018.

(51) Int. Cl.
*H03K 17/689* (2006.01)
*H03H 11/04* (2006.01)
*H01H 59/00* (2006.01)

(52) U.S. Cl.
CPC ................... *H01H 59/0009* (2013.01)

(58) Field of Classification Search
CPC ....... H03M 7/28; H03M 7/00; H01H 59/0009
See application file for complete search history.

(56) References Cited

U.S. PATENT DOCUMENTS

| 6,308,231 | B1* | 10/2001 | Galecki | G05B 19/054 |
| | | | | 702/127 |
| 9,019,137 | B1* | 4/2015 | Waltari | H03M 1/1245 |
| | | | | 341/150 |
| 10,075,179 | B1* | 9/2018 | Keane | H03M 1/765 |
| 2013/0169456 | A1* | 7/2013 | Cheong | H03M 1/108 |
| | | | | 341/120 |
| 2015/0097637 | A1* | 4/2015 | Pye | H01F 27/2804 |
| | | | | 333/174 |
| 2015/0372676 | A1* | 12/2015 | Teggatz | H03K 17/162 |
| | | | | 327/379 |

* cited by examiner

*Primary Examiner* — Alfonso Perez Borroto
*Assistant Examiner* — Esayas G Yeshaw
(74) *Attorney, Agent, or Firm* — Withrow & Terranova, P.L.L.C.

(57) ABSTRACT

A microelectromechanical systems (MEMS) switching circuit and related apparatus is provided. A MEMS apparatus includes a MEMS switching circuit and a control circuit. The MEMS switching circuit includes a first number of MEMS switches, each configured to close and open based on a high driving voltage and a low driving voltage, respectively. The MEMS switching circuit includes a MEMS-based driver circuit configured to receive a second number of control signals that collectively identify a selected MEMS switch among the first number of MEMS switches. Accordingly, the MEMS-based driver circuit decodes the second number of control signals and causes the selected MEMS switch to close. By using a lesser number of control signals to control a larger number of MEMS switches, it may be possible to reduce control lines between the control circuit and the MEMS switching circuit, thus helping to reduce routing complexity and footprint of the MEMS apparatus.

20 Claims, 7 Drawing Sheets

MICROELECTROMECHANICAL SYSTEMS (MEMS) SWITCHING CIRCUIT AND RELATED APPARATUS

RELATED APPLICATIONS

This application claims the benefit of U.S. provisional patent application Ser. No. 62/680,240, filed on Jun. 4, 2018, the disclosure of which is incorporated herein by reference in its entirety.

FIELD OF THE DISCLOSURE

The technology of the disclosure relates generally to operating microelectromechanical systems (MEMS) switches in an electrical circuit.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE) and fifth-generation new-radio (5G-NR). In this regard, a mobile communication device may need to operate in a variety of operation modes, such as multiple-input multiple-output (MIMO) spatial diversity, MIMO spatial multiplexing, and/or radio frequency (RF) beamforming. In addition, it may be necessary for the mobile communication device to communicate an RF signal(s), either concurrently or alternately, in different RF bands associated with different wireless communication technologies. As such, the mobile communication device may include a number of RF filters for communicating the RF signal(s) in different RF bands. Accordingly, the mobile communication device may employ a number of switches to toggle the RF signal(s) between different RF filters in different operation modes.

Notably, a conventional switch, such as a silicon-on-insulator (SOI) switch, may create a relatively higher on-resistance ($R_{ON}$) when the conventional switch is closed and a relatively higher off-capacitance ($C_{OFF}$) when the conventional switch is opened. Accordingly, the conventional switch may suffer a degraded figure-of-merit (FOM) (FOM=$R_{ON} \times C_{OFF}$) and cause unwanted insertion loss to degrade RF efficiency and/or performance of the mobile communication device. In contrast, a microelectromechanical systems (MEMS) switch typically has a FOM that is at least ⅓ lower than the FOM of the conventional SOI switch. As a result, it may be possible to reduce the unwanted insertion loss associated with the conventional SOI switch by replacing the conventional SOI switch with the MEMS switch, thus helping to improve RF efficiency and/or performance of the mobile communication device.

SUMMARY

Aspects disclosed in the detailed description include a microelectromechanical systems (MEMS) switching circuit and related apparatus. A MEMS apparatus can be configured to include a MEMS switching circuit and a control circuit. In examples discussed herein, the MEMS switching circuit and the control circuit are provided in separate semiconductor dies. The MEMS switching circuit includes a first number of MEMS switches, each configured to close and open based on a high driving voltage (e.g., 40 V) and a low driving voltage (e.g., 0 V), respectively. The MEMS switching circuit includes a MEMS-based driver circuit configured to receive a second number of control signals that collectively identify a selected MEMS switch among the first number of MEMS switches. Accordingly, the MEMS-based driver circuit decodes the second number of control signals and causes the selected MEMS switch to close by applying the high driver voltage to the selected MEMS switch. By using a lesser number of control signals to control a larger number of MEMS switches, it may be possible to reduce control lines between the control circuit and the MEMS switching circuit, thus helping to reduce routing complexity and footprint of the MEMS apparatus.

In one aspect, a MEMS switching circuit is provided. The MEMS switching circuit includes a first number of MEMS switches each configured to close and open in response to receiving a high driving voltage and a low driving voltage, respectively. The MEMS switching circuit also includes a MEMS-based driver circuit coupled to the first number of MEMS switches. The MEMS-based driver circuit is configured to receive a second number of control signals configured to collectively identify a selected MEMS switch among the first number of MEMS switches. The MEMS-based driver circuit is also configured to decode the second number of control signals to determine the selected MEMS switch. The MEMS-based driver circuit is also configured to provide the high driving voltage to the selected MEMS switch to close the selected MEMS switch.

In another aspect, a MEMS apparatus is provided. The MEMS apparatus includes a MEMS switching circuit. The MEMS switching circuit includes a first number of MEMS switches each configured to close and open in response to receiving a high driving voltage and a low driving voltage, respectively. The MEMS switching circuit also includes a MEMS-based driver circuit coupled to the first number of MEMS switches. The MEMS-based driver circuit is configured to receive a second number of control signals configured to collectively identify a selected MEMS switch among the first number of MEMS switches. The MEMS-based driver circuit is also configured to decode the second number of control signals to determine the selected MEMS switch. The MEMS-based driver circuit is also configured to provide the high driving voltage to the selected MEMS switch to close the selected MEMS switch. The MEMS apparatus also includes a control circuit coupled to the MEMS-based driver circuit. The control circuit is configured to provide the second number of control signals to the MEMS-based driver circuit.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
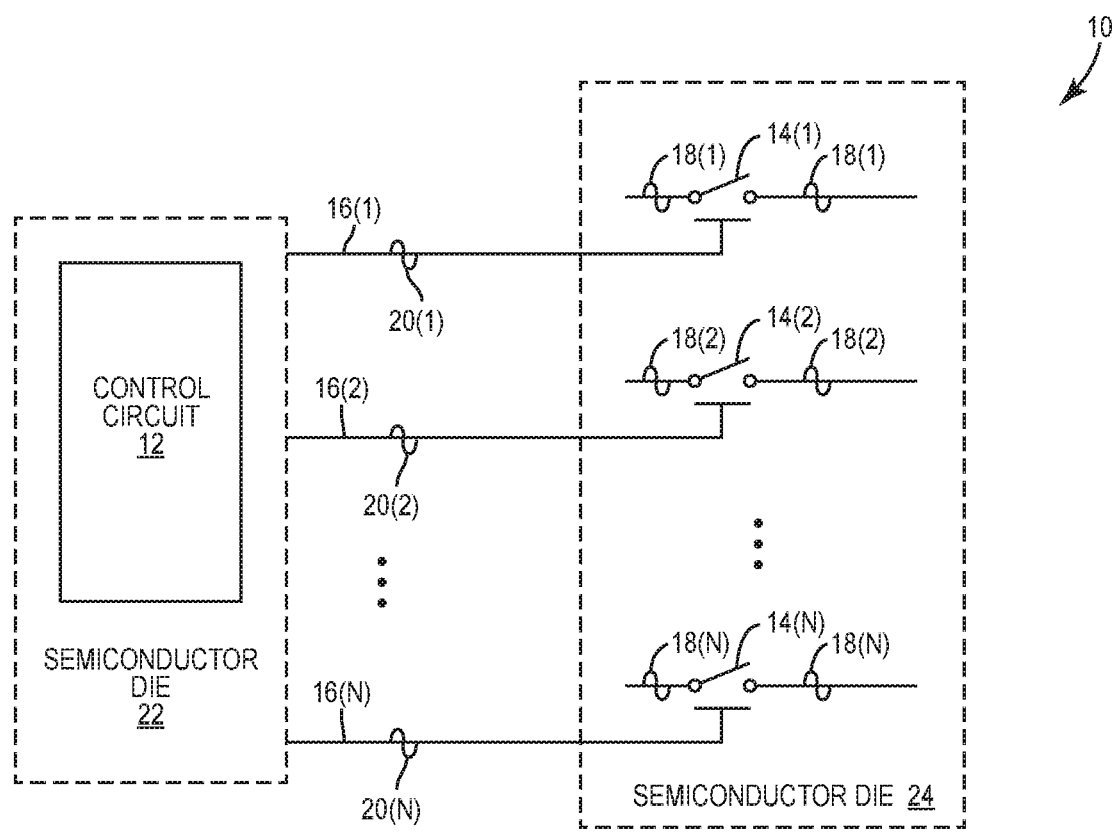
FIG. 1 is a schematic diagram of an existing microelectromechanical systems (MEMS) apparatus in which a control circuit is configured to control a number of MEMS switches based on an equal number of control lines.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a microelectromechanical systems (MEMS) switching circuit and related apparatus. A MEMS apparatus can be configured to include a MEMS switching circuit and a control circuit. In examples discussed herein, the MEMS switching circuit and the control circuit are provided in separate semiconductor dies. The MEMS switching circuit includes a first number of MEMS switches, each configured to close and open based on a high driving voltage (e.g., 40 V) and a low driving voltage (e.g., 0 V), respectively. The MEMS switching circuit includes a MEMS-based driver circuit configured to receive a second number of control signals that collectively identify a selected MEMS switch among the first number of MEMS switches. Accordingly, the MEMS-based driver circuit decodes the second number of control signals and causes the selected MEMS switch to close by applying the high driver voltage to the selected MEMS switch. By using a lesser number of control signals to control a larger number of MEMS switches, it may be possible to reduce control lines between the control circuit and the MEMS switching circuit, thus helping to reduce routing complexity and footprint of the MEMS apparatus.

Before discussing a MEMS switching circuit and a related MEMS apparatus of the present disclosure, a brief overview of an existing MEMS apparatus employing individual control lines for controlling a number of MEMS switches is first provided with reference to FIG. 1. The discussion of specific exemplary aspects of the MEMS switching circuit and the related MEMS apparatus of the present disclosure starts below with reference to FIG. 2.

In this regard, FIG. 1 is a schematic diagram of an existing MEMS apparatus 10 in which a control circuit 12 is configured to control a number of MEMS switches 14(1)-14(N) based on an equal number of control lines 16(1)-16(N). The MEMS switches 14(1)-14(N) may be closed concurrently or individually to couple a number of RF signals 18(1)-18(N) to such active/passive circuits as RF filters and/or antennas (not shown). The control circuit 12 may be configured to control the MEMS switches 14(1)-14(N) via a number of control signals 20(1)-20(N), respectively. The control signals 20(1)-20(N) are provided from the control circuit 12 to the MEMS switches 14(1)-14(N) via the control lines 16(1)-16(N), respectively. In this regard, the number of the control lines 16(1)-16(N) equals the number of MEMS switches 14(1)-14(N).

The control circuit 12 may be provided in a first semiconductor die 22, while the MEMS switches 14(1)-14(N) are provided in a second semiconductor die 24 separated from the first semiconductor die 22. The existing MEMS apparatus 10 may include a large number of the MEMS switches 14(1)-14(N) (e.g., N=16, 32, 64, 128, 256, and so on) when provided in a wireless communication device (not shown) to support such RF technologies as multiple-input multiple-output (MIMO) and/or beamforming in a millimeter wave (mmWave) RF spectrum. Accordingly, it may be necessary to route an equal number of the control lines 16(1)-16(N) between the first semiconductor die 22 and the second semiconductor die 24 for controlling the MEMS switches 14(1)-14(N). As a result, it may be necessary to provide the existing MEMS apparatus 10 on a larger footprint to accommodate an increased number of the control lines 16(1)-16(N). In this regard, it may be desired to reduce the number of control lines 16(1)-16(N) between the first semiconductor die 22 and the second semiconductor die 24, particularly when the second semiconductor die 24 includes a larger number of MEMS switches 14(1)-14(N).

Figure 2:
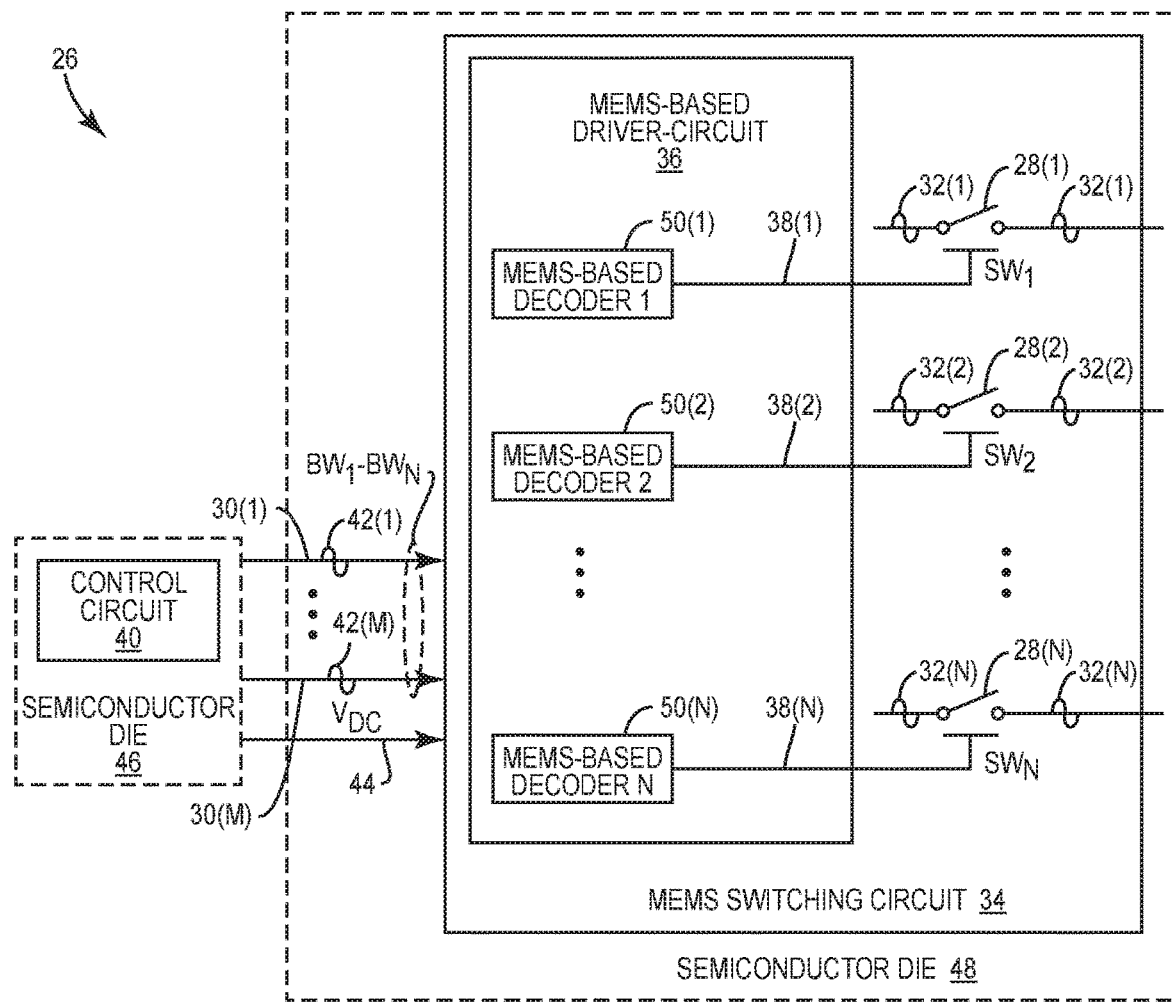
FIG. 2 is a schematic diagram of an exemplary MEMS apparatus configured according to an embodiment of the present disclosure to control a number of MEMS switches based on a lesser number of control lines to help reduce routing complexity and footprint of the MEMS apparatus.

FIG. 2 is a schematic diagram of an exemplary MEMS apparatus 26 configured according to an embodiment of the present disclosure to control a first number of MEMS switches 28(1)-28(N) (denoted and referenced interchangeably as "$SW_1$-$SW_N$") based on a second number of control lines 30(1)-30(M) (M<N) to help reduce routing complexity and footprint of the MEMS apparatus 26. For the convenience of mathematical expression, N and M are hereinafter referred to as the "first number" and the "second number," respectively.

Each of the MEMS switches 28(1)-28(N) can be closed and opened in response to receiving a high driving voltage (e.g., 40 V) and a low driving voltage (e.g., 0 V), respectively. In a non-limiting example, the MEMS switches 28(1)-28(N) can be closed to pass a number of RF signals 32(1)-32(N), respectively, to RF filters and/or antennas (not shown) coupled to the MEMS switches 28(1)-28(N). In contrast, the MEMS switches 28(1)-28(N) can be opened to block the RF signals 32(1)-32(N) from RF filters and/or antennas.

The MEMS apparatus 26 includes a MEMS switching circuit 34. The MEMS switching circuit 34 includes the MEMS switches 28(1)-28(N) and a MEMS-based driver circuit 36 coupled to MEMS switches 28(1)-28(N) via a number of driving voltage lines 38(1)-38(N), respectively. In this regard, the MEMS switching circuit 34 includes an equal number of the driving voltage lines 38(1)-38(N) as the MEMS switches 28(1)-28(N).

The MEMS apparatus 26 includes a control circuit 40, which can be a microprocessor, a microcontroller, or a field-programmable gate array (FPGA), for example. The control circuit 40 is coupled to the MEMS-based driver circuit 36 via the second number of control lines 30(1)-30(M). The control circuit 40 is configured to provide a second number of control signals 42(1)-42(M) to the MEMS-based driver circuit 36 via the second number of control lines 30(1)-30(M), respectively. In addition, the control circuit 40 also provides a direct current (DC) voltage $V_{DC}$ to the MEMS-based driver circuit 36 via a DC voltage line 44. In a non-limiting example, the DC voltage $V_{DC}$ is greater than or equal to the high driving voltage (e.g., 40 V).

The control circuit 40 can be configured to generate the control signals 42(1)-42(M) to collectively identify a selected MEMS switch among the MEMS switches 28(1)-28(N) to be closed by the MEMS-based driver circuit 36. The MEMS-based driver circuit 36 receives and decodes the control signals 42(1)-42(M) to determine the selected MEMS switch identified by the control signals 42(1)-42(M). Accordingly, the MEMS-based driver circuit 36 closes the selected MEMS switch by applying the DC voltage $V_{DC}$ to the selected MEMS switch as the high driving voltage.

In a non-limiting example, the control circuit 40 is provided in a first semiconductor die 46 and the MEMS switching circuit 34 is provided in a second semiconductor die 48 separate from the first semiconductor die 46. In contrast to the existing MEMS apparatus 10 of FIG. 1, the MEMS apparatus 26 employs a lesser number of the control lines 30(1)-30(M) than the MEMS switches 28(1)-28(N) (M<N). As such, it may be possible to reduce routing complexity between the first semiconductor die 46 and the second semiconductor die 48, thus helping to reduce the footprint of the MEMS apparatus 26.

In a non-limiting example, the first number N and the second number M can be determined based on the equation (Eq. 1) below.

$$2^M \geq N \qquad\qquad (Eq.\ 1)$$

In accordance to the equation (Eq. 1) above, the control circuit 40 may be configured to program the control signals 42(1)-42(M) to collectively represent a first number of binary codewords $BW_1$-$BW_N$ to uniquely identify the MEMS switches 28(1)-28(N), respectively. The control circuit 40 may assert the high driving voltage (e.g., 40 V) on a selected control line among the control lines 30(1)-30(M) such that a corresponding control signal among the control signals 42(1)-42(M) can represent a binary one (1) in any of the binary codewords $BW_1$-$BW_N$. In contrast, the control circuit may de-assert the high driving voltage or assert the low driving voltage (e.g., 0 V) on the selected control line such that the corresponding control signal can represent a binary zero (0) in any of the binary codewords $BW_1$-$BW_N$.

The MEMS-based driver circuit 36 can be configured to include a first number of MEMS-based decoders 50(1)-50(N) coupled to the MEMS switches 28(1)-28(N), respectively. In this regard, there exists an equal number of the MEMS-based decoders 50(1)-50(N) and the MEMS switches 28(1)-28(N). The MEMS-based decoders 50(1)-50(N) are configured in accordance to the binary codewords $BW_1$-$BW_N$, respectively. A non-limiting example for configuring the MEMS-based decoders 50(1)-50(N) in accordance to the binary codewords $BW_1$-$BW_N$ will be provided in reference to FIGS. 4A-4I later.

In this regard, when the control circuit 40 generates the control signals 42(1)-42(M) to collectively represent a selected binary codeword among the binary codewords $BW_1$-$BW_N$, a selected MEMS-based decoder, which is configured in accordance to the selected binary codeword, among the MEMS-based decoders 50(1)-50(N) can decode the selected binary codeword. Accordingly, the selected MEMS-based decoder may apply the DC voltage $V_{DC}$ as the high driving voltage to cause the selected MEMS switch to close. In a non-limiting example, those MEMS-based decoders among the MEMS-based decoders 50(1)-50(N) not configured in accordance to the selected binary codeword can open the rest of the MEMS switches (other than the selected MEMS switch) among the MEMS switches 28(1)-28(N).

Figure 3:
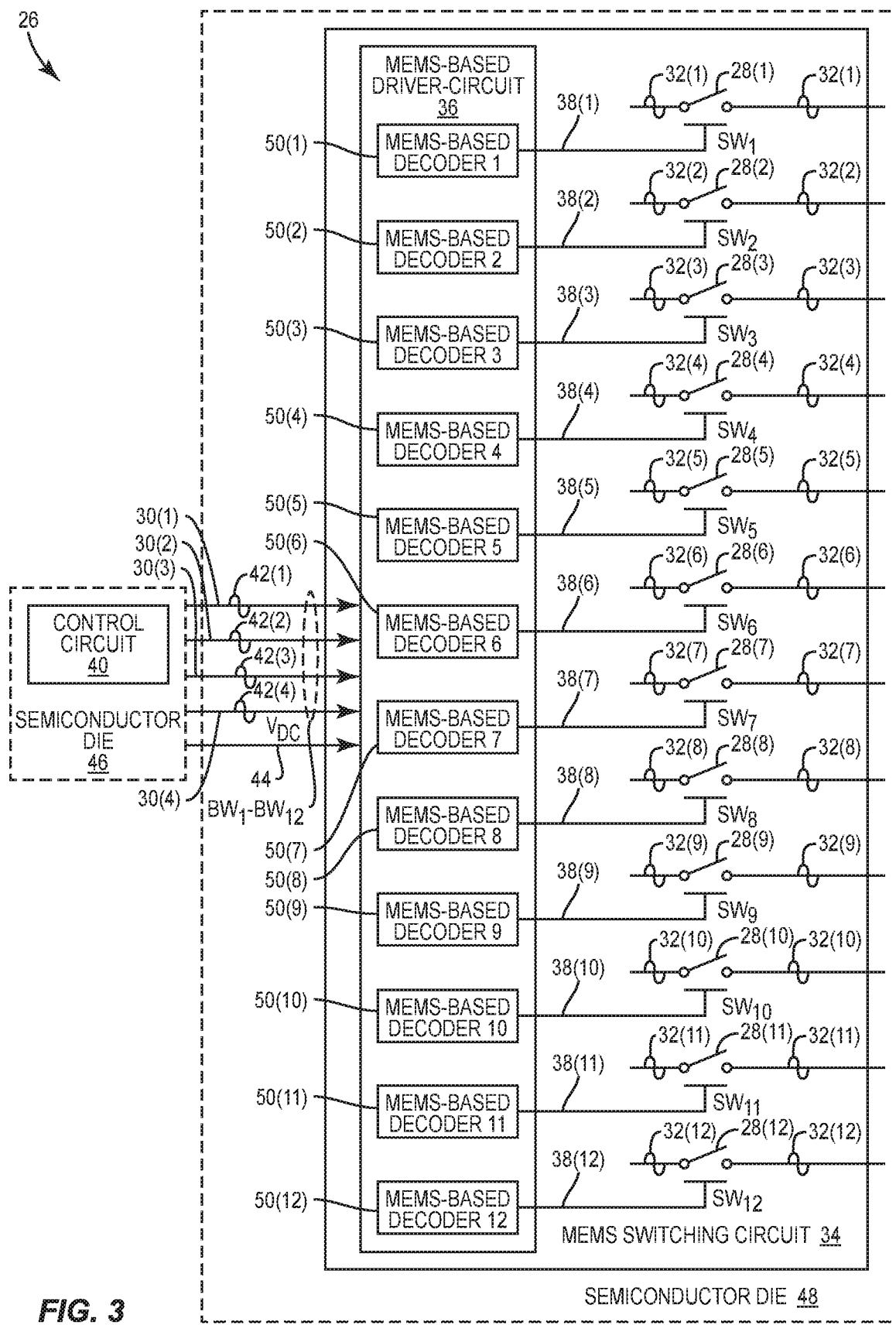
FIG. 3 is a schematic diagram providing an exemplary illustration of the MEMS apparatus of FIG. 2 configured according to an embodiment of the present disclosure to control twelve (12) MEMS switches based on four (4) control lines.

In a non-limiting example, the MEMS switching circuit 34 includes twelve (12) MEMS switches. As such, the first number N equals twelve (12). According to the equation (Eq. 1) above, the second number M needs to be four (4). In this regard, FIG. 3 is a schematic diagram providing an exemplary illustration of the MEMS apparatus 10 of FIG. 2 configured according to an embodiment of the present disclosure to control the 12 MEMS switches 28(1)-28(12) (denoted and referenced interchangeably as "$SW_1$-$SW_{12}$") based on 4 control lines 30(1)-30(4). Common elements between FIGS. 2 and 3 are shown therein with common element numbers and will not be re-described herein.

According to the previous discussion in FIG. 2, the control circuit 40 can be configured to generate 12 binary codewords $BW_1$-$BW_{12}$ collectively based on the control signals 42(1)-42(4). The 12 binary codewords $BW_1$-$BW_{12}$ are configured to uniquely identify the 12 MEMS switches 28(1)-28(12), respectively. The control circuit 40 may assert the high driving voltage (e.g., 40 V) on a selected control line among the control lines 30(1)-30(4) such that a corresponding control signal among the control signals 42(1)-42(4) can represent a binary 1 in any of the 12 binary codewords $BW_1$-$BW_{12}$. In contrast, the control circuit may de-assert the high driving voltage or assert the low driving voltage (e.g., 0 V) on the selected control line such that the corresponding control signal can represent a binary 0 in any of the binary codewords $BW_1$-$BW_{12}$. In a non-limiting example, the control circuit 40 can generate the 12 binary codewords $BW_1$-$BW_{12}$ based on an encoding table (Table 1) below.

TABLE 1

| Binary Codeword $BW_1$-$BW_{12}$ | Control Signal 42(4) | Control Signal 42(3) | Control Signal 42(2) | Control Signal 42(1) | MEMS Switch Identified by Binary Codeword $BW_1$-$BW_{12}$ |
|---|---|---|---|---|---|
| $BW_1$ | 0 | 0 | 0 | 1 | $SW_1$/28(1) |
| $BW_2$ | 0 | 0 | 1 | 0 | $SW_2$/28(2) |
| $BW_3$ | 0 | 0 | 1 | 1 | $SW_3$/28(3) |
| $BW_4$ | 0 | 1 | 0 | 0 | $SW_4$/28(4) |
| $BW_5$ | 0 | 1 | 0 | 1 | $SW_5$/28(5) |
| $BW_6$ | 0 | 1 | 1 | 0 | $SW_6$/28(6) |
| $BW_7$ | 0 | 1 | 1 | 1 | $SW_7$/28(7) |
| $BW_8$ | 1 | 0 | 0 | 0 | $SW_8$/28(8) |
| $BW_9$ | 1 | 0 | 0 | 1 | $SW_9$/28(9) |
| $BW_{10}$ | 1 | 0 | 1 | 0 | $SW_{10}$/28(10) |
| $BW_{11}$ | 1 | 0 | 1 | 1 | $SW_{11}$/28(11) |
| $BW_{12}$ | 1 | 1 | 0 | 0 | $SW_{12}$/28(12) |

For example, to generate the binary codeword $BW_1$ to uniquely identify the MEMS switch 28(1), the control circuit 40 may generate the control signal 42(1) at the high driving voltage (e.g., 40 V), while generating the control signals 42(2)-42(4) at the low driving voltage (e.g., 0 V). By providing the 4 control lines 30(1)-30(4) in the MEMS apparatus 26, the 4 control signals 42(1)-42(4) can collectively represent up to 16 binary codewords (0000-1111). However, given that the MEMS switching circuit 34 only includes 12 MEMS switches, the binary codewords 1101-1111 are reserved. In addition, the binary codeword 0000 can be configured to cause all of the 12 MEMS switches 28(1)-28(12) to be concurrently opened.

The MEMS-based driver circuit 36 includes the MEMS-based decoders 50(1)-50(12) (denoted as "MEMS-based Decoder 1-MEMS-based Decoder 12"). The MEMS-based decoders 50(1)-50(12) are configured in accordance to the binary codewords $BW_1$-$BW_{12}$, respectively. Depending on the selected binary codeword represented collectively by the control signals 42(1)-42(4), one of the MEMS-based decoders 50(1)-50(12) is uniquely identified by the selected binary codeword and can thus decode the selected binary codeword. Accordingly, the MEMS-based decoder can apply the DC voltage $V_{DC}$ as the high driving voltage to close the MEMS switch coupled to the MEMS-based decoder.

In a non-limiting example, each of the MEMS-based decoders 50(1)-50(12) includes an equal number of MEMS switches as the number of the control signals 42(1)-42(4). In this regard, each of the MEMS-based decoders 50(1)-50(12) includes 4 MEMS switches configured in accordance to a respective binary codeword among the binary codewords $BW_1$-$BW_{12}$. FIGS. 4A-4L are schematic diagrams providing exemplary illustrations of the MEMS-based decoders 50(1)-50(12) in the MEMS-based driver circuit 36 of FIG. 3. Common elements between FIGS. 3 and 4A-4L are shown therein with common element numbers and will not be re-described herein.

Figure 4B:
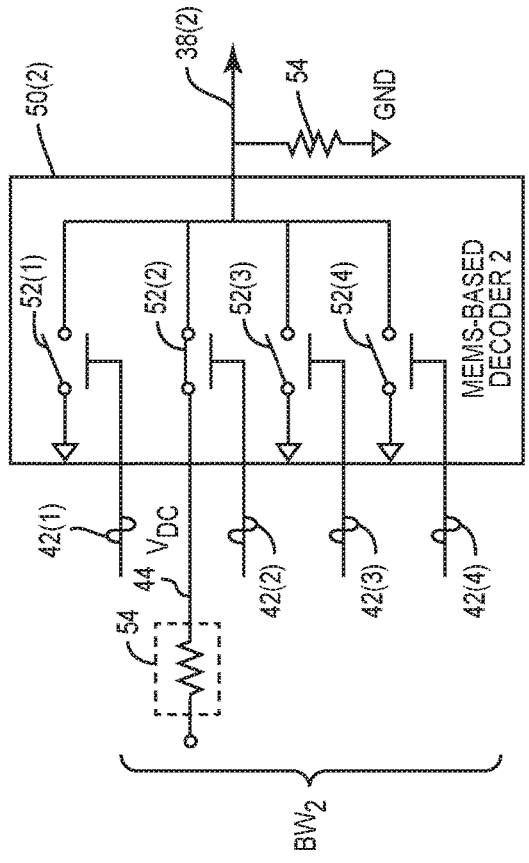
FIGS. 4A-4L are schematic diagrams providing exemplary illustrations of 12 MEMS-based decoders that can be included in the MEMS apparatus of FIGS. 2 and 3.
Figure 4D:
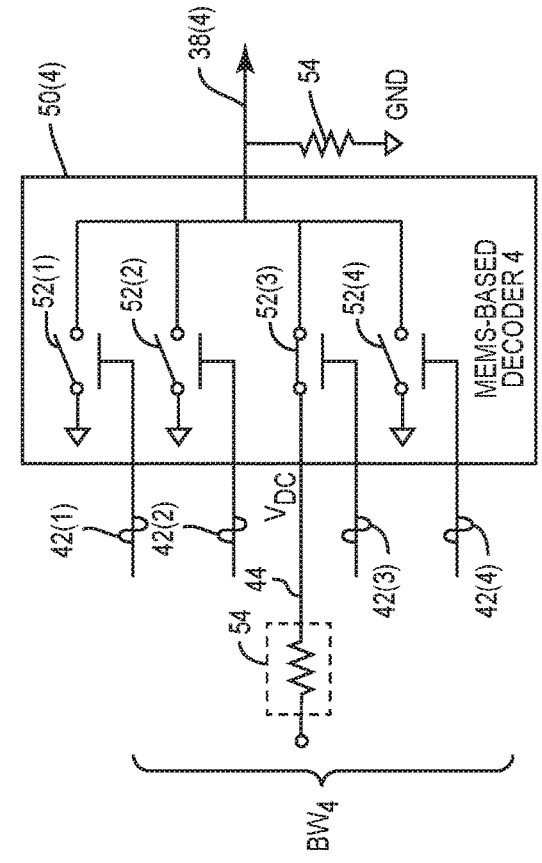
Figure 4A:
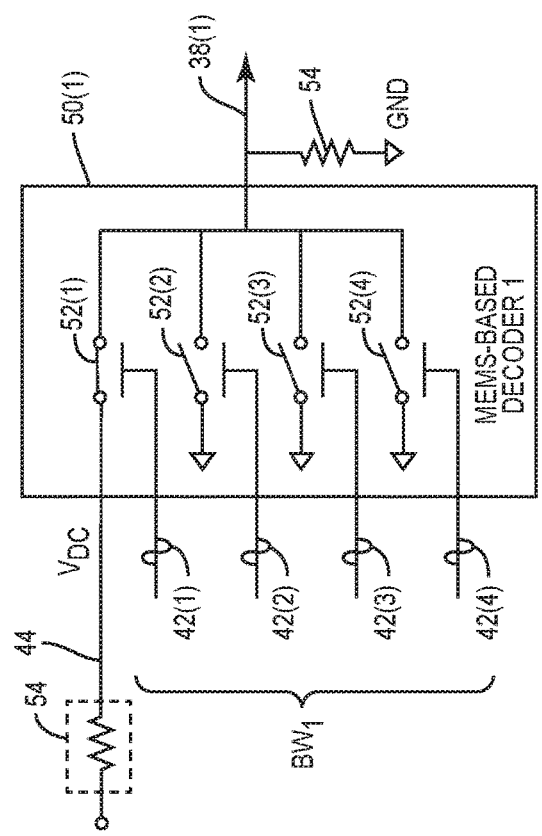

FIG. 4A is a schematic diagram providing an exemplary illustration of the MEMS-based decoder 50(1) of FIG. 3. The MEMS-based decoder 50(1) includes 4 MEMS switches 52(1)-52(4). The MEMS switches 52(1)-52(4) are opened or closed by the control signals 42(1)-42(4), respectively. Notably, the MEMS-based decoder 50(1) is configured in accordance to the binary codeword $BW_1$ in the encoding table (Table 1) above. In this regard, when the control signals 42(1)-42(4) collectively represent the binary codeword $BW_1$, the MEMS switch 52(1) is closed and the MEMS switches 52(2)-52(4) are opened, thus outputting the DC voltage $V_{DC}$ on the driving voltage line 38(1) to close the MEMS switch 28(1) (not shown) in the MEMS switching circuit 34 of FIG. 3. The MEMS-based decoder 50(1) may include a resistor 54 coupled between the driving voltage line 38(1) and a ground GND. The resistor 54 may be configured to pull down the driving voltage line 38(1) in the event that the control signals 42(1)-42(4) collectively represent a different binary codeword than the binary codeword $BW_1$. In an alternative embodiment, it may also be possible to couple the resistor 54 to the DC voltage line 44.

FIG. 4B is a schematic diagram providing an exemplary illustration of the MEMS-based decoder 50(2) of FIG. 3. The MEMS-based decoder 50(2) is configured in accordance to the binary codeword $BW_2$ in the encoding table (Table 1) above. In this regard, when the control signals 42(1)-42(4) collectively represent the binary codeword $BW_2$, the MEMS switch 52(2) is closed and the MEMS switches 52(1), 52(3), and 52(4) are opened, thus outputting the DC voltage $V_{DC}$ on the driving voltage line 38(2) to close the MEMS switch 28(2) (not shown) in the MEMS switching circuit 34 of FIG. 3.

Figure 4C:
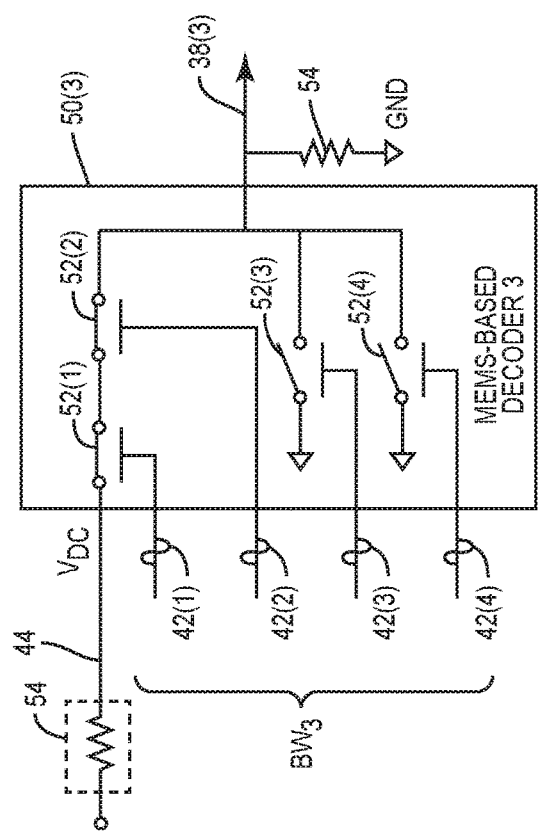

FIG. 4C is a schematic diagram providing an exemplary illustration of the MEMS-based decoder 50(3) of FIG. 3. The MEMS-based decoder 50(3) is configured in accordance to the binary codeword $BW_3$ in the encoding table (Table 1) above. In this regard, when the control signals 42(1)-42(4) collectively represent the binary codeword $BW_3$, the MEMS switches 52(1) and 52(2) are closed and the MEMS switches 52(3) and 52(4) are opened, thus outputting the DC voltage $V_{DC}$ on the driving voltage line 38(3) to close the MEMS switch 28(3) (not shown) in the MEMS switching circuit 34 of FIG. 3.

FIG. 4D is a schematic diagram providing an exemplary illustration of the MEMS-based decoder 50(4) of FIG. 3. The MEMS-based decoder 50(4) is configured in accordance to the binary codeword $BW_4$ in the encoding table (Table 1) above. In this regard, when the control signals 42(1)-42(4) collectively represent the binary codeword BW$_4$, the MEMS switch 52(3) is closed and the MEMS switches 52(1), 52(2), and 52(4) are opened, thus outputting the DC voltage V$_{DC}$ on the driving voltage line 38(4) to close the MEMS switch 28(4) (not shown) in the MEMS switching circuit 34 of FIG. 3.

Figure 4E:
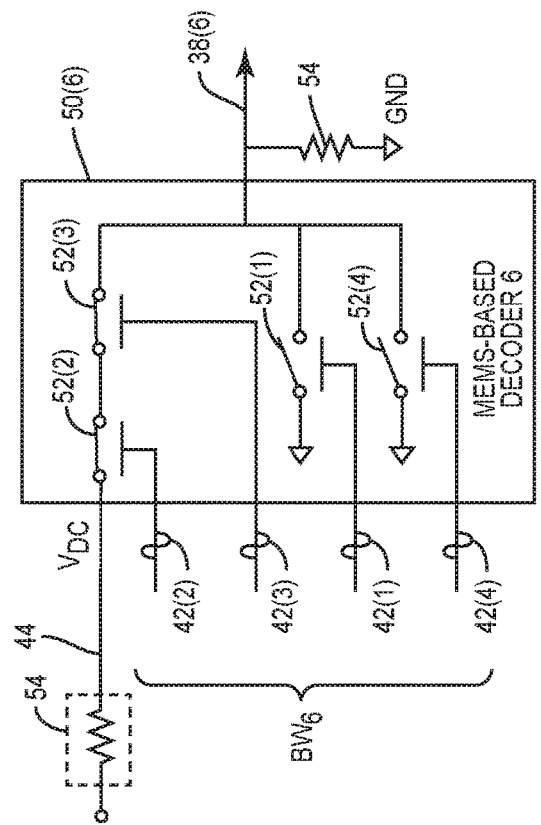

FIG. 4E is a schematic diagram providing an exemplary illustration of the MEMS-based decoder 50(5) of FIG. 3. The MEMS-based decoder 50(5) is configured in accordance to the binary codeword BW$_5$ in the encoding table (Table 1) above. In this regard, when the control signals 42(1)-42(4) collectively represent the binary codeword BW$_5$, the MEMS switches 52(1) and 52(3) are closed and the MEMS switches 52(2) and 52(4) are opened, thus outputting the DC voltage V$_{DC}$ on the driving voltage line 38(5) to close the MEMS switch 28(5) (not shown) in the MEMS switching circuit 34 of FIG. 3.

Figure 4F:
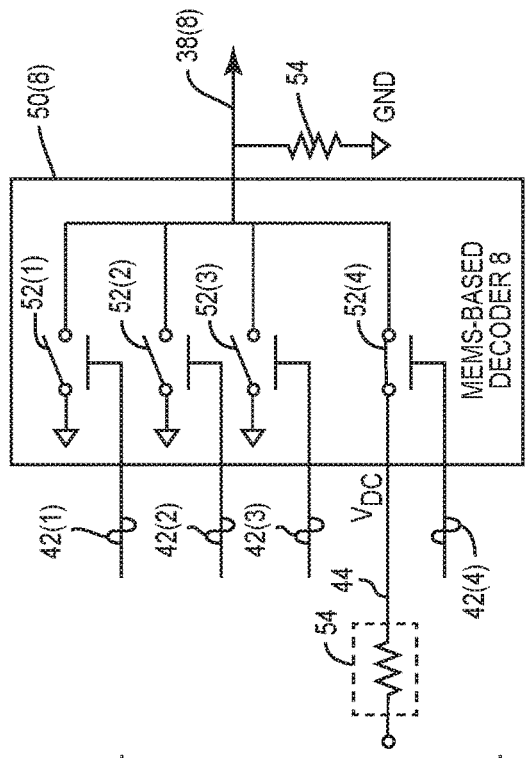

FIG. 4F is a schematic diagram providing an exemplary illustration of the MEMS-based decoder 50(6) of FIG. 3. The MEMS-based decoder 50(6) is configured in accordance to the binary codeword BW$_6$ in the encoding table (Table 1) above. In this regard, when the control signals 42(1)-42(4) collectively represent the binary codeword BW$_6$, the MEMS switches 52(2) and 52(3) are closed and the MEMS switches 52(1) and 52(4) are opened, thus outputting the DC voltage V$_{DC}$ on the driving voltage line 38(6) to close the MEMS switch 28(6) (not shown) in the MEMS switching circuit 34 of FIG. 3.

Figure 4G:
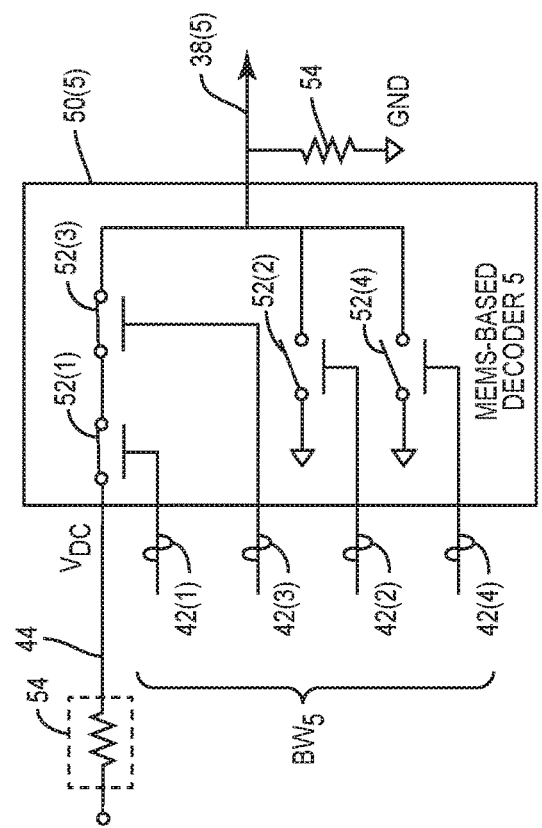

FIG. 4G is a schematic diagram providing an exemplary illustration of the MEMS-based decoder 50(7) of FIG. 3. The MEMS-based decoder 50(7) is configured in accordance to the binary codeword BW$_7$ in the encoding table (Table 1) above. In this regard, when the control signals 42(1)-42(4) collectively represent the binary codeword BW$_7$, the MEMS switches 52(1), 52(2), and 52(3) are closed and the MEMS switch 52(4) is opened, thus outputting the DC voltage V$_{DC}$ on the driving voltage line 38(7) to close the MEMS switch 28(7) (not shown) in the MEMS switching circuit 34 of FIG. 3.

Figure 4H:
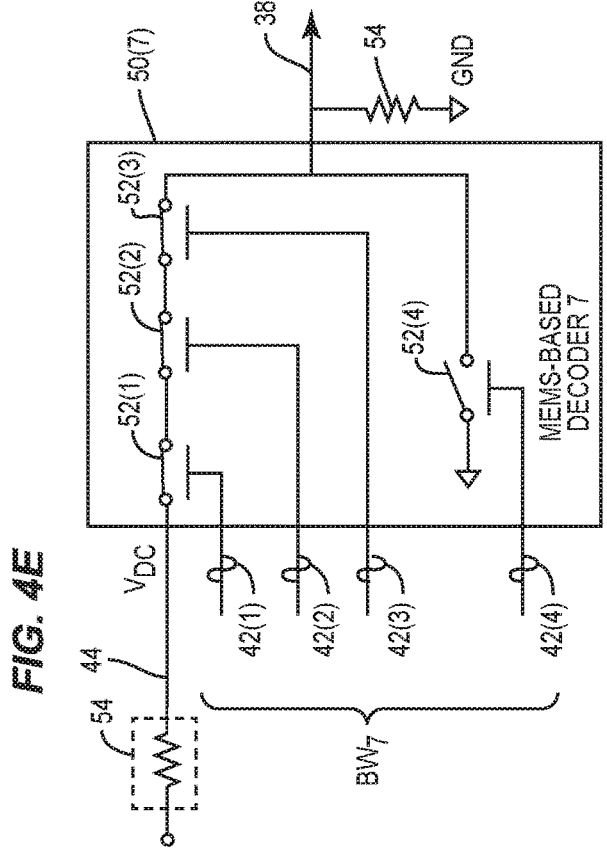

FIG. 4H is a schematic diagram providing an exemplary illustration of the MEMS-based decoder 50(8) of FIG. 3. The MEMS-based decoder 50(8) is configured in accordance to the binary codeword BW$_8$ in the encoding table (Table 1) above. In this regard, when the control signals 42(1)-42(4) collectively represent the binary codeword BW$_8$, the MEMS switch 52(4) is closed and the MEMS switches 52(1), 52(3), and 52(3) are opened, thus outputting the DC voltage V$_{DC}$ on the driving voltage line 38(8) to close the MEMS switch 28(8) (not shown) in the MEMS switching circuit 34 of FIG. 3.

Figure 4I:
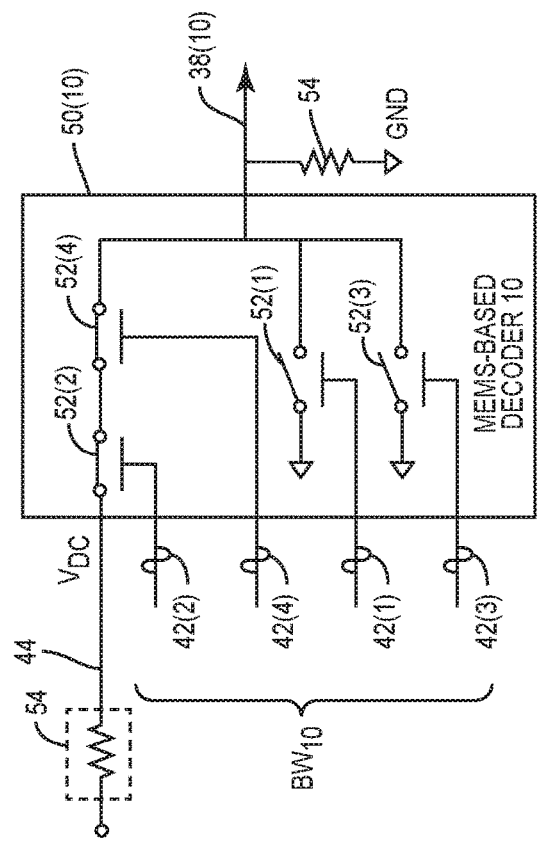

FIG. 4I is a schematic diagram providing an exemplary illustration of the MEMS-based decoder 50(9) of FIG. 3. The MEMS-based decoder 50(9) is configured in accordance to the binary codeword BW$_9$ in the encoding table (Table 1) above. In this regard, when the control signals 42(1)-42(4) collectively represent the binary codeword BW$_9$, the MEMS switches 52(1) and 52(4) are closed and the MEMS switches 52(2) and 52(3) are opened, thus outputting the DC voltage V$_{DC}$ on the driving voltage line 38(9) to close the MEMS switch 28(9) (not shown) in the MEMS switching circuit 34 of FIG. 3.

Figure 4J:
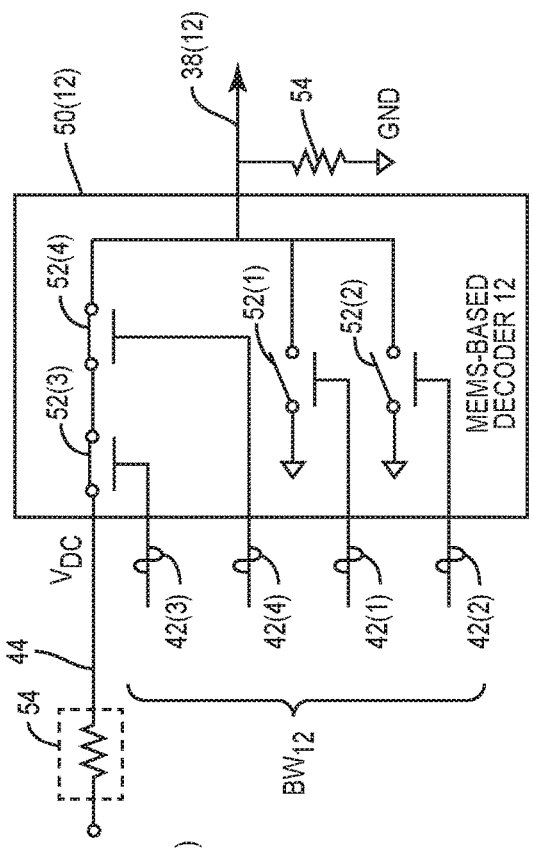

FIG. 4J is a schematic diagram providing an exemplary illustration of the MEMS-based decoder 50(10) of FIG. 3. The MEMS-based decoder 50(10) is configured in accordance to the binary codeword BW$_{10}$ in the encoding table (Table 1) above. In this regard, when the control signals 42(1)-42(4) collectively represent the binary codeword BW$_{10}$, the MEMS switches 52(2) and 52(4) are closed and the MEMS switches 52(1) and 52(3) are opened, thus outputting the DC voltage V$_{DC}$ on the driving voltage line 38(10) to close the MEMS switch 28(10) (not shown) in the MEMS switching circuit 34 of FIG. 3.

Figure 4K:
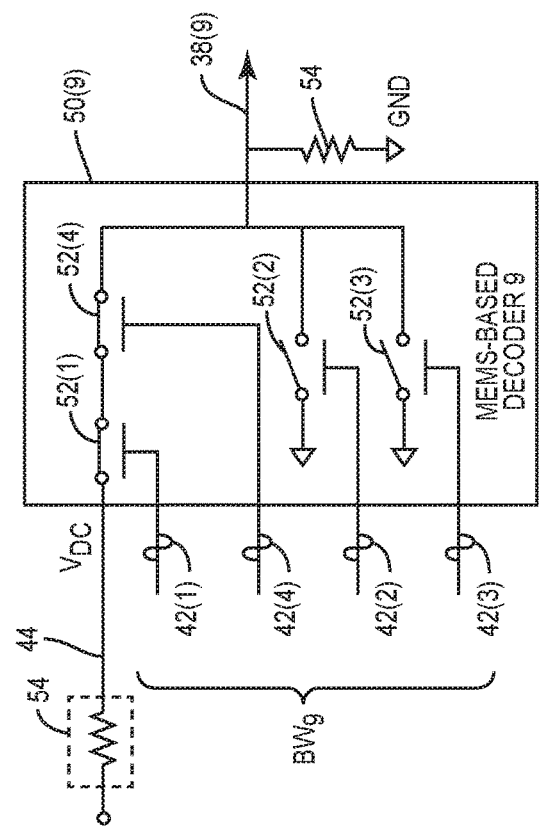

FIG. 4K is a schematic diagram providing an exemplary illustration of the MEMS-based decoder 50(11) of FIG. 3. The MEMS-based decoder 50(11) is configured in accordance to the binary codeword BW$_{11}$ in the encoding table (Table 1) above. In this regard, when the control signals 42(1)-42(4) collectively represent the binary codeword BW$_1$, the MEMS switches 52(1), 52(2), and 52(4) are closed and the MEMS switch 52(3) is opened, thus outputting the DC voltage V$_{DC}$ on the driving voltage line 38(11) to close the MEMS switch 28(11) (not shown) in the MEMS switching circuit 34 of FIG. 3.

Figure 4L:
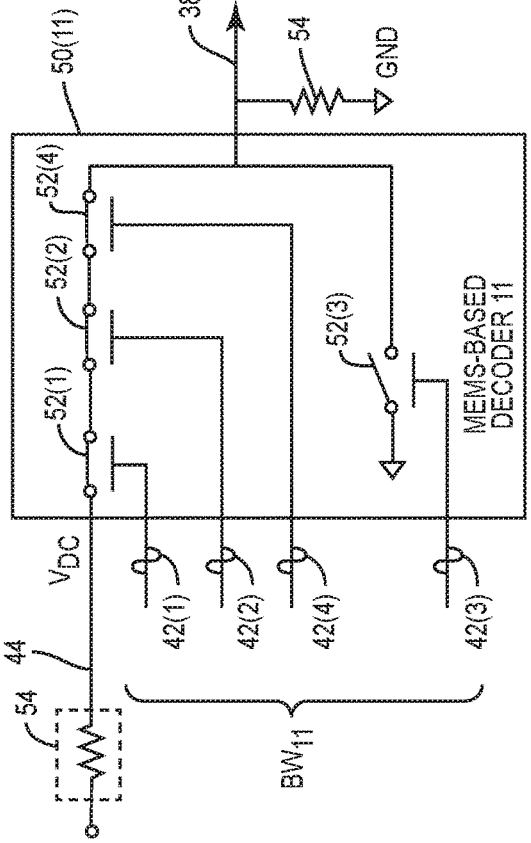

FIG. 4L is a schematic diagram providing an exemplary illustration of the MEMS-based decoder 50(12) of FIG. 3. The MEMS-based decoder 50(12) is configured in accordance to the binary codeword BW$_{12}$ in the encoding table (Table 1) above. In this regard, when the control signals 42(1)-42(4) collectively represent the binary codeword BW$_{12}$, the MEMS switches 52(3) and 52(4) are closed and the MEMS switches 52(1) and 52(2) are opened, thus outputting the DC voltage V$_{DC}$ on the driving voltage line 38(12) to close the MEMS switch 28(12) (not shown) in the MEMS switching circuit 34 of FIG. 3.

Figure 5A:
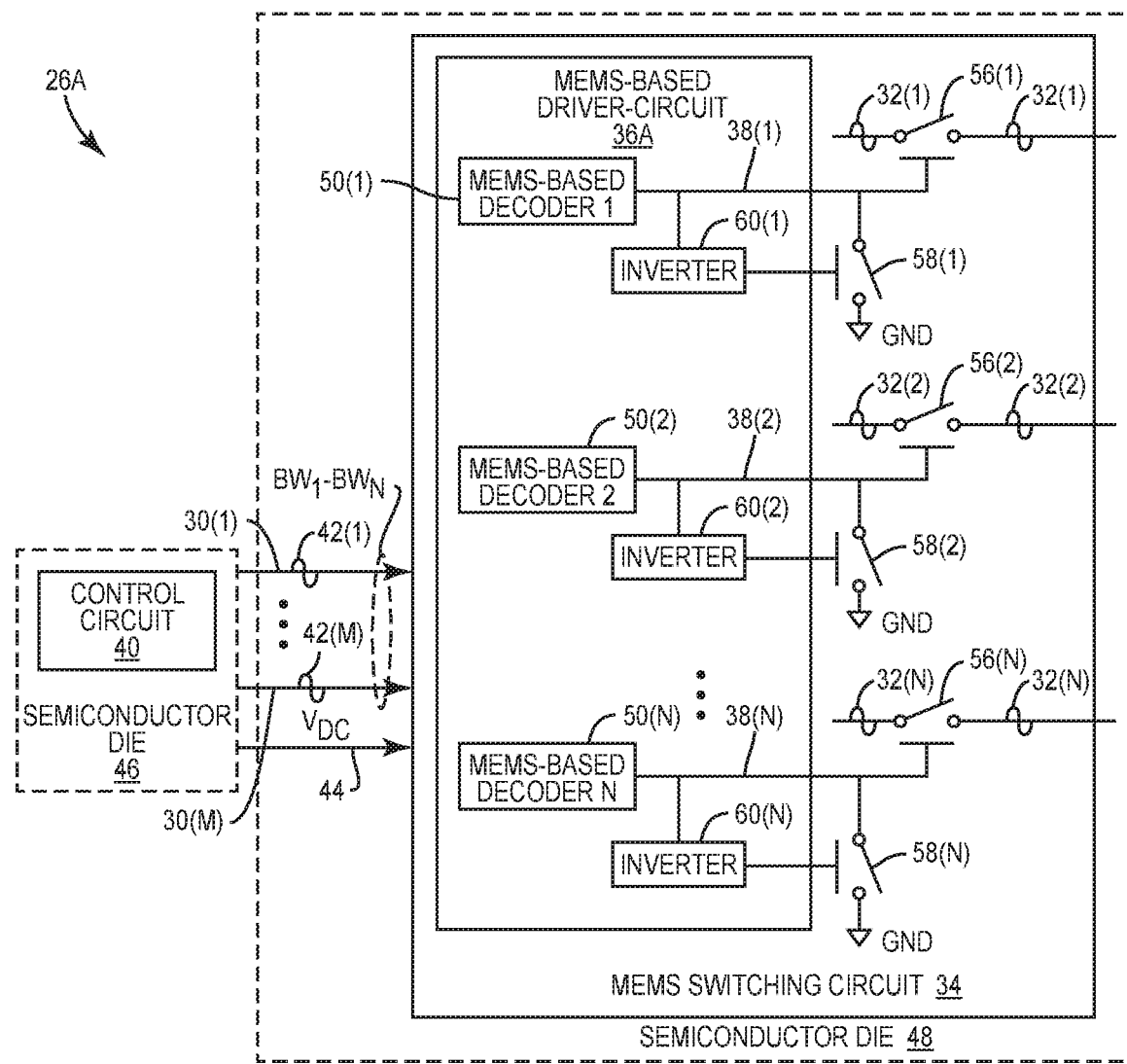
FIG. 5A is a schematic diagram of an exemplary MEMS apparatus configured according to an embodiment of the present disclosure to control a number of MEMS switches and a number of MEMS shunt switches based on a lesser number of control lines.

FIG. 5A is a schematic diagram of an exemplary MEMS apparatus 26A configured according to an embodiment of the present disclosure to control a first number of MEMS switches 56(1)-56(N) (denoted and referenced interchangeably as "SW$_1$-SW$_N$") and a first number of MEMS shunt switches 58(1)-58(N) based on a second number of control lines 30(1)-30(M) (M<N). Common elements between FIGS. 2 and 5A are shown therein with common element numbers and will not be re-described herein.

The MEMS apparatus 26A includes a MEMS-based driver circuit 36A. The MEMS-based driver circuit 36A includes a first number of MEMS-based inverters 60(1)-60(N) (denoted as "Inverters") coupled to the MEMS-based decoders 50(1)-50(N), respectively. The MEMS-based inverters 60(1)-60(N) are configured to operate (open or close) the MEMS shunt switches 58(1)-58(N), respectively.

More specifically, each of the MEMS-based inverters 60(1)-60(N) is configured to open a coupled MEMS shunt switch among the MEMS shunt switches 58(1)-58(N) in response to a coupled MEMS-based decoder among the MEMS-based decoders 50(1)-50(N) outputting the high driving voltage. For example, the MEMS-based inverter 60(1) is configured to output the low driving voltage to open the MEMS shunt switch 58(1) when the MEMS-based decoder 50(1) outputs the high driving voltage to close the MEMS switch 56(1).

Each of the MEMS-based inverters 60(1)-60(N) is also configured to close a coupled MEMS shunt switch among the MEMS shunt switches 58(1)-58(N) in response to a coupled MEMS-based decoder among the MEMS-based decoders 50(1)-50(N) is outputting the low driving voltage. For example, the MEMS-based inverter 60(1) is configured to output the high driving voltage to close the MEMS shunt switch 58(1) when the MEMS-based decoder 50(1) outputs the low driving voltage to open the MEMS switch 56(1).

Figure 5B:
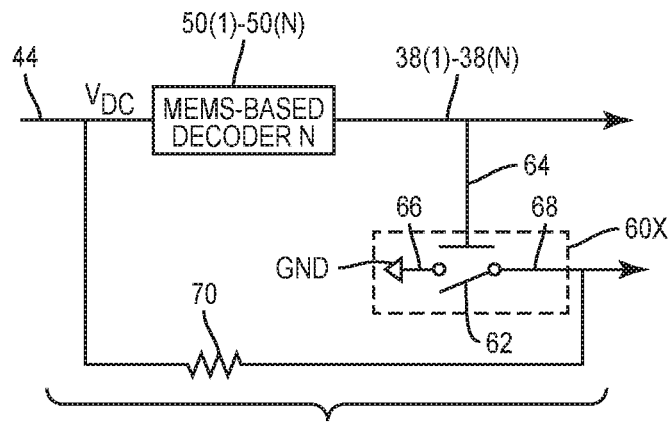
FIG. 5B is a schematic diagram of an exemplary MEMS-based inverter, which can be provide in the MEMS apparatus of FIG. 5A for controlling the MEMS shunt switches.

FIG. 5B is a schematic diagram of an exemplary MEMS-based inverter 60X, which can be provided in the MEMS apparatus 26A of FIG. 5A as any of the MEMS-based inverters 60(1)-60(N). Common elements between FIGS. 5A and 5B are shown therein with common element numbers and will not be re-described herein.

The MEMS-based inverter 60X includes a MEMS switch 62. The MEMS switch 62 has a control end 64 coupled to the driving voltage lines 38(1)-38(N). The MEMS switch 62 has a second end 66 coupled to the GND and a third end 68 coupled to the DC voltage line 44 via a resistor 70. The resistor 70 may be configured to limit electrical current flowing from the third end 68 to the GND through the MEMS switch 62 when the MEMS switch 62 is closed.

In this regard, when the MEMS-based decoders 50(1)-50(N) output the high driving voltage on the driving voltage lines 38(1)-38(N), the MEMS switch 62 is closed, thus outputting the low driving voltage (by coupling to the GND). In contrast, when the MEMS-based decoders 50(1)-50(N) output the low driving voltage on the driving voltage lines 38(1)-38(N), the MEMS switch 62 is opened, thus outputting the high driving voltage (by coupling to the DC voltage line 44).

Those skilled in the art will recognize improvements and modifications to the embodiments of the present disclosure. All such improvements and modifications are considered within the scope of the concepts disclosed herein and the claims that follow.

What is claimed is:

1. A microelectromechanical systems (MEMS) switching circuit comprising:
    a first number of MEMS switches each configured to close and open in response to receiving a high driving voltage and a low driving voltage, respectively; and
    a MEMS-based driver circuit coupled to the first number of MEMS switches and configured to:
        receive a second number of control signals configured to collectively identify a selected MEMS switch among the first number of MEMS switches;
        decode the second number of control signals to determine the selected MEMS switch; and
        provide the high driving voltage to the selected MEMS switch to close the selected MEMS switch.

2. The MEMS switching circuit of claim 1 wherein the second number of control signals is smaller than the first number of MEMS switches.

3. The MEMS switching circuit of claim 1 wherein the second number of control signals to-the-power-of-two is greater than or equal to the first number of MEMS switches.

4. The MEMS switching circuit of claim 1 wherein the MEMS-based driver circuit is further configured to receive and provide a direct current (DC) voltage to the selected MEMS switch as the high driving voltage.

5. The MEMS switching circuit of claim 1 wherein the MEMS-based driver circuit comprises a first number of MEMS-based decoders coupled to the first number of MEMS switches, respectively, wherein the first number of MEMS-based decoders quantitatively equals the first number of MEMS switches and are configured to:
    decode the second number of control signals to determine the selected MEMS switch; and
    provide the high driving voltage to the selected MEMS switch to close the selected MEMS switch.

6. The MEMS switching circuit of claim 5 wherein the second number of control signals is further configured to collectively define a first number of binary codewords uniquely identifying the first number of MEMS-based decoders, respectively, wherein each of the first number of binary codewords comprises one or more binary ones (1s) corresponding to assertions of one or more of the second number of control signals.

7. The MEMS switching circuit of claim 6 wherein each of the first number of MEMS-based decoders comprises a second number of MEMS switches arranged in accordance to a respective binary codeword among the first number of binary codewords, wherein the second number of MEMS switches quantitatively equals the second number of control signals.

8. The MEMS switching circuit of claim 6 wherein:
    the second number of control signals is further configured to collectively represent a selected binary codeword among the first number of binary codewords to uniquely identify a selected MEMS-based decoder among the first number of MEMS-based decoders; and
    the selected MEMS-based decoder is configured to:
        decode the second number of control signals to determine the selected MEMS switch; and
        provide the high driving voltage to the selected MEMS switch to close the selected MEMS switch.

9. The MEMS switching circuit of claim 8 further comprising:
    a first number of MEMS shunt switches coupled to the first number of MEMS switches, respectively, wherein each of the first number of MEMS shunt switches is configured to close and open in response to receiving the high driving voltage and the low driving voltage, respectively; and
    a first number of MEMS-based inverters coupled to the first number of MEMS-based decoders, respectively, wherein each of the first number of MEMS-based inverters is configured to:
        provide the low driving voltage to open a coupled MEMS shunt switch among the first number of MEMS shunt switches in response to a coupled MEMS-based decoder among the first number of MEMS-based decoders outputting the high driving voltage; and
        provide the high driving voltage to close the coupled MEMS shunt switch in response to the coupled MEMS-based decoder outputting the low driving voltage.

10. A microelectromechanical systems (MEMS) apparatus comprising:
    a MEMS switching circuit comprising;
        a first number of MEMS switches each configured to close and open in response to receiving a high driving voltage and a low driving voltage, respectively; and
        a MEMS-based driver circuit coupled to the first number of MEMS switches and configured to:
            receive a second number of control signals configured to collectively identify a selected MEMS switch among the first number of MEMS switches;
            decode the second number of control signals to determine the selected MEMS switch; and
            provide the high driving voltage to the selected MEMS switch to close the selected MEMS switch; and
    a control circuit coupled to the MEMS-based driver circuit and configured to provide the second number of control signals to the MEMS-based driver circuit.

11. The MEMS apparatus of claim 10 comprising:
    a first semiconductor die comprising the MEMS switching circuit; and
    a second semiconductor die comprising the control circuit.

12. The MEMS apparatus of claim 10 wherein:
the control circuit is further configured to:
- determine the selected MEMS switch among the first number of MEMS switches to be closed;
- generate the second number of control signals to collectively identify the selected MEMS switch; and
- provide the second number of control signals and a direct current (DC) voltage to the MEMS-based driver circuit; and the MEMS-based driver circuit is further configured to provide the DC voltage to the selected MEMS switch as the high driving voltage.

13. The MEMS apparatus of claim 10 wherein the second number of control signals is smaller than the first number of MEMS switches.

14. The MEMS apparatus of claim 10 wherein the second number of control signals to the-power-of-two is greater than or equal to the first number of MEMS switches.

15. The MEMS apparatus of claim 10 wherein the MEMS-based driver circuit comprises a first number of MEMS-based decoders coupled to the first number of MEMS switches, respectively, wherein the first number of MEMS-based decoders quantitatively equals the first number of MEMS switches and are configured to:
- decode the second number of control signals to determine the selected MEMS switch; and
- provide the high driving voltage to the selected MEMS switch to close the selected MEMS switch.

16. The MEMS apparatus of claim 15 wherein the control circuit is further configured to generate the second number of control signals to collectively define a first number of binary codewords uniquely identifying the first number of MEMS-based decoders, respectively, wherein each of the first number of binary codewords comprises one or more binary ones (1s) corresponding to assertions of one or more of the second number of control signals.

17. The MEMS apparatus of claim 16 wherein each of the first number of MEMS-based decoders comprises a second number of MEMS switches arranged in accordance to a respective binary codeword among the first number of binary codewords, the second number of MEMS switches quantitatively equal the second number of control signals.

18. The MEMS apparatus of claim 16 wherein:
the second number of control signals is further configured to collectively represent a selected binary codeword among the first number of binary codewords to uniquely identify a selected MEMS-based decoder among the first number of MEMS-based decoders; and
the selected MEMS-based decoder is configured to:
- decode the second number of control signals to determine the selected MEMS switch; and
- provide the high driving voltage to the selected MEMS switch to close the selected MEMS switch.

19. The MEMS apparatus of claim 18 further comprising:
a first number of MEMS shunt switches coupled to the first number of MEMS switches, respectively, wherein each of the first number of MEMS shunt switches is configured to close and open in response to receiving the high driving voltage and the low driving voltage, respectively; and
a first number of MEMS-based inverters coupled to the first number of MEMS-based decoders, respectively, wherein each of the first number of MEMS-based inverters is configured to:
- provide the low driving voltage to open a coupled MEMS shunt switch among the first number of MEMS shunt switches in response to a coupled MEMS-based decoder among the first number of MEMS-based decoders outputting the high driving voltage; and
- provide the high driving voltage to close the coupled MEMS shunt switch in response to the coupled MEMS-based decoder outputting the low driving voltage.

20. The MEMS apparatus of claim 19 wherein each of the first number of MEMS-based inverters comprises a MEMS switch configured to be closed in response to the coupled MEMS-based decoder outputting the high driving voltage and opened in response to the coupled MEMS-based decoder outputting the low driving voltage.

* * * * *